United States Patent
Gao et al.

(10) Patent No.: US 9,413,160 B2
(45) Date of Patent: Aug. 9, 2016

(54) PROTECTION CIRCUIT AND A GATE DRIVING CIRCUITRY

(75) Inventors: Yuan Gao, Cugnaux (FR); Patrice Besse, Tournefeuille (FR); Thierry Laplagne, Cugnaux (FR)

(73) Assignee: Freescale Semiconductor, Inc., Austin, TX (US)

( * ) Notice: Subject to any disclaimer, the term of this patent is extended or adjusted under 35 U.S.C. 154(b) by 127 days.

(21) Appl. No.: 14/394,675

(22) PCT Filed: Apr. 19, 2012

(86) PCT No.: PCT/IB2012/001611
§ 371 (c)(1),
(2), (4) Date: Oct. 15, 2014

(87) PCT Pub. No.: WO2013/156811
PCT Pub. Date: Oct. 24, 2013

(65) Prior Publication Data
US 2015/0098160 A1    Apr. 9, 2015

(51) Int. Cl.
| | | |
|---|---|---|
| *H02H 3/20* | (2006.01) | |
| *H02H 9/04* | (2006.01) | |
| *H02H 3/28* | (2006.01) | |
| *H03K 17/082* | (2006.01) | |
| *H03K 17/10* | (2006.01) | |

(52) U.S. Cl.
CPC .............. *H02H 3/28* (2013.01); *H03K 17/0822* (2013.01); *H03K 17/102* (2013.01)

(58) Field of Classification Search
CPC ........... H02H 3/20; H02H 9/04; H02H 9/041; H02H 7/18
USPC ......................................................... 361/91.1
See application file for complete search history.

(56) References Cited

U.S. PATENT DOCUMENTS

| | | | | | |
|---|---|---|---|---|---|
| 5,563,759 | A | * | 10/1996 | Nadd ................. | H03K 17/0828 323/277 |
| 5,635,821 | A | * | 6/1997 | Smith .................. | H02J 7/0031 320/103 |
| 6,324,044 | B1 | * | 11/2001 | Teggatz ................ | G06F 13/385 327/379 |

(Continued)

FOREIGN PATENT DOCUMENTS

EP         1130777 A2     9/2001

OTHER PUBLICATIONS

MAX1614, Maxim Integrated datasheet 2011, Maxim Integrated 160 Rio Robles, San Jose, CA 95134 USA, pp. 1-9.

(Continued)

*Primary Examiner* — Dharti Patel
(74) *Attorney, Agent, or Firm* — Charlene R. Jacobsen (57) ABSTRACT

A protection circuit and a gate driving circuitry. The protection circuit is for protecting a p-type back-to-back MOS switch. The circuit receives an input driving signal and provides a driving output signal to common gates of the p-type back-to-back MOS switch. The circuit comprises a driving signal insulation switch for disconnecting the common gate of the p-type back-to-back MOS switch from the received input driving signal when the voltage of the common gates is larger than the supply voltage of the circuit. The circuit further comprises a gate source coupling switch for coupling a voltage received at the common source of the p-type back-to-back MOS switch to the common gate if a received voltage at the common sources is larger than a reference voltage Vref.

20 Claims, 4 Drawing Sheets

(56) References Cited

U.S. PATENT DOCUMENTS

| | | | | |
|---|---|---|---|---|
| 6,967,468 | B2 * | 11/2005 | Felder | H02J 7/0031 320/134 |
| 7,358,627 | B2 * | 4/2008 | Black | H02M 7/538 307/125 |
| 7,940,503 | B2 * | 5/2011 | Volke | H03K 17/0822 361/56 |
| 8,582,259 | B2 * | 11/2013 | Murakami | H03K 17/0822 361/56 |
| 2008/0204958 | A1 * | 8/2008 | Shearon | H02H 3/18 361/93.9 |
| 2009/0289691 | A1 | 11/2009 | Fuller et al. | |
| 2011/0084339 | A1 | 4/2011 | Besse et al. | |

OTHER PUBLICATIONS

LT4351, Linear Technology datasheet 2003, Linear Technology Corporation 1630 McCarthy Blvd., Milpitas, CA 95035-7417, pp. 1-20.
International Search Report and Written Opinion correlating to PCT/IB2012/001611 dated Mar. 26, 2013.

* cited by examiner

Prior Art

PROTECTION CIRCUIT AND A GATE DRIVING CIRCUITRY

FIELD OF THE INVENTION

This invention relates to a protection circuit for a p-type back-to-back MOS switch gate driver.

BACKGROUND OF THE INVENTION

Figure 1:
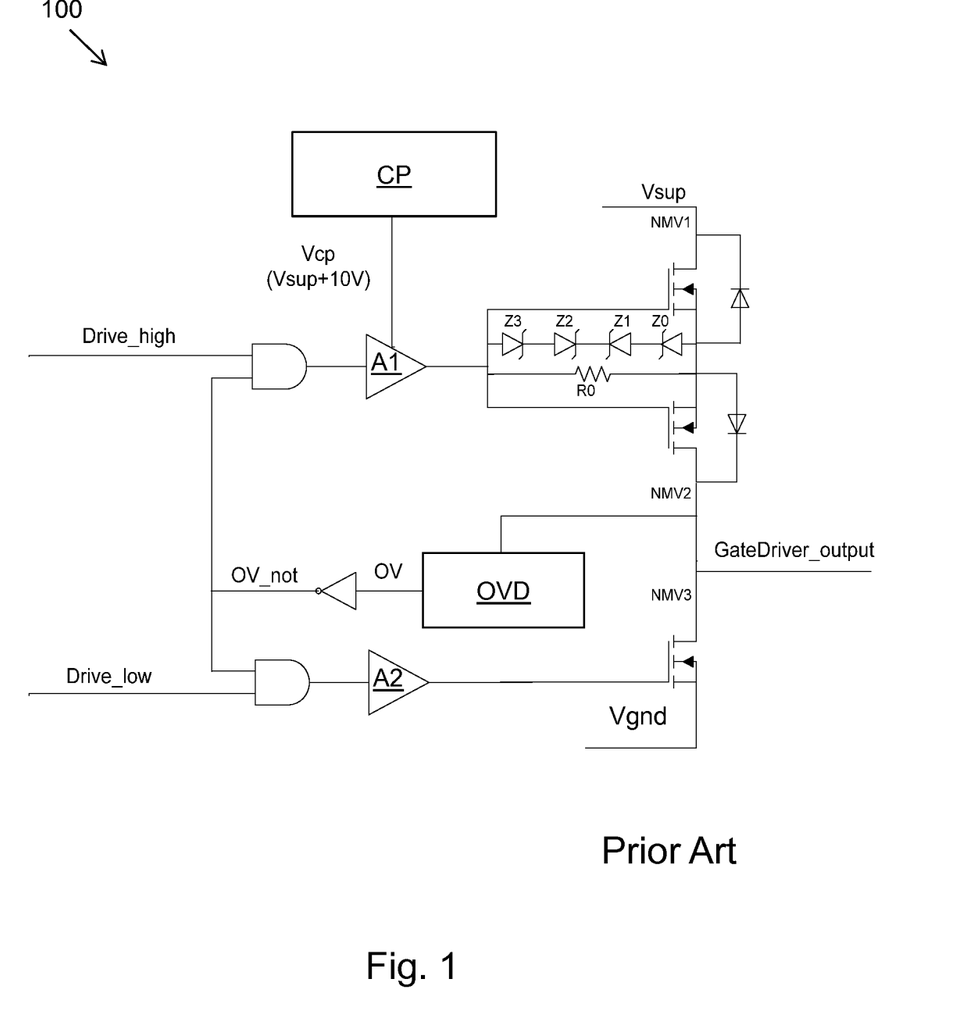
FIG. 1 schematically shows an example of a prior art embodiment of a gate driving circuitry, FIG. 2 schematically shows an example of a gate driving circuitry comprising a protection circuit, FIG. 3a schematically shows an example of a gate source coupling switch, FIG. 3b schematically shows another example of a gate source coupling switch, and FIG. 4 schematically shows another example of a gate driving circuitry comprising a protection circuit.

FIG. 1 presents a part of known gate driving circuit 100 which is protected against high voltages which may be received from the gate which is driven by circuit 100 in circumstances of DC over stress, such as a short to a voltage source, a load dump, and in circumstances of Electrostatic Sensitivity Device (ESD) ElectroMagnetic Compatibility (EMC) system level stress.

In dependence of the gate control input signal, the output terminal GateDriver_Output is connected to the supply voltage Vsup via an n-type back-to-back MOS switch, or connected to the ground via another circuit (NMV3). The n-type back-to-back MOS switch is formed by n-type MOSFETS NMV1, NMV2 that have common gates and common sources. Because of the use of n-type MOSFETS, the gates of the MOSFETS NMV1, NMV2 must be driven by a voltage that is higher than the supply voltage Vsup. Therefore, an amplifying circuit A1 is coupled in the input signal path which amplifies the signal to higher voltage levels. The amplifier receives a higher supply voltage from a charge pump circuitry CP. The charge pump circuitry CP is, when manufactured on a semiconductor material, a relatively large circuitry, and, thus, a relatively expensive solution.

As the result of stress in a circuit, which is driven by the signal of the output terminal GateDriver_Output, high voltages may be received at the output terminal GateDriver_Output. Such high voltage may damage and destruct the MOSFETs NMV1, NMV2 during fast transient like ESD or gun stress. Zener diodes Z2, Z3 are inserted in the circuit to protect the MOSFETs NMV1, NMV2 against too high voltage differences between the common sources and the common gates. Resistor R0 acts as a passive pulldown of MOSFETs NMV1, NMV2. Zener diodes Z0 and Z1 are inserted to avoid the gate-source voltage of NMV1 and NMV2 are not clamped by Z2 and Z3 (about 1.2V) to ensure the normal function. Such a configuration with zener diodes and a resistor results in an undesired current injection during the high voltage event on the output terminal GateDriver_Output.

The OverVoltage Detection circuitry OVD detects whether the voltage at the GateDriver_output terminal is too high and uses an inverter and two logic AND circuits to provide a low signal to the amplifiers A1, A2 which control the n-type back-to-back MOS switch and the nMOSFET NMV3. If the signal received by the amplifiers A1, A2 is low, their output will be connected to ground and excessive high voltages, which may be received at the output of the amplifiers A1, A2, are coupled to the ground voltage Vgnd.

SUMMARY OF THE INVENTION

The present invention provides a protection circuit for a p-type back-to-back MOS switch gate driver, a gate driving circuitry and an integrated circuit device as described in the accompanying claims.

Specific embodiments of the invention are set forth in the dependent claims.

These and other aspects of the invention will be apparent from and elucidated with reference to the embodiments described hereinafter.

BRIEF DESCRIPTION OF THE DRAWINGS

Further details, aspects and embodiments of the invention will be described, by way of example only, with reference to the drawings. Elements in the figures are illustrated for simplicity and clarity and have not necessarily been drawn to scale.

DETAILED DESCRIPTION OF THE PREFERRED EMBODIMENTS

Figure 2:
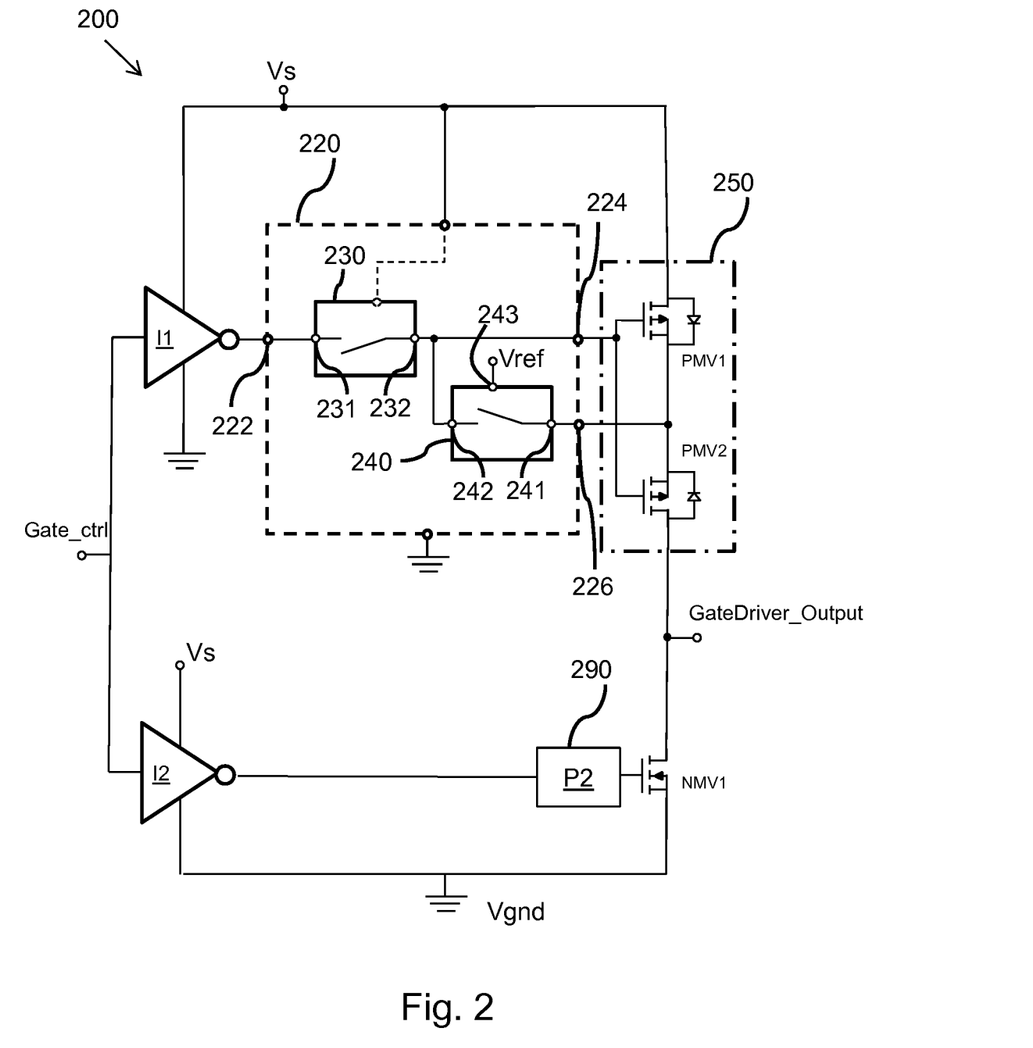

FIG. 2 schematically shows an example of an embodiment of a gate driving circuitry 200 comprising a protection circuit 220. The gate driving circuitry 200 comprises two inverters I1, I2, a protection circuit 220, a protection circuit 290, a p-type back-to-back MOS switch 250 and a nMOSFET NMV1. A gate_ctrl signal is inverted by the inverters I1, I2. The series arrangement of the inverter I1, the protection circuit 220 and the p-type back-to-back MOS switch 250 couple the GateDriver_Output terminal of the gate driving circuitry 200 to the supply voltage Vs if the input signal gate_ctrl is high. The series arrangement of the inverter I2, the protection circuit 290 and the nMOSFET NMV1 couple the GateDriver_Output terminal of the gate driving circuitry 200 to the supply voltage Vgnd if the input signal gate_ctrl is low. The protection circuit 290 protects the nMOSFET NMV1 for damage and destruction.

The p-type back-to-back MOS switch 250 comprises two pMOSFETs PMV1, PMV2 of which the sources are connected to each other and the gates are connected to each other. In FIG. 2 the body diodes of the pMOSFETs PMV1, PMV2 are drawn for sake of clarity. It is to be noted that other MOSFETs drawn in this application also comprises a body diode as the direct result of the structure of MOSFETs manufactured in semiconductor material.

If the common gates of the p-type back-to-back MOS switch 250 receive a low signal, the p-type back-to-back MOS switch provides a current path from the supply voltage Vs to the GateDriver_Output terminal of the circuitry.

If the common gates receive a high signal which means, a signal that is substantially equal to the supply voltage, both channels of the pMOSFETs PMV1, PMV2 are non-conducting. The voltage at the common source of the p-type back-to-back MOS switch 250 will be the supply voltage Vs level. At that particular moment NMV1 is conducting and, thus, the voltage of GateDriver_Output is low. Thus, the current path through the body diode of PMV2 is also non-conducting. Thus, if the common gates receive a high signal (being substantially equal to the supply voltage Vs), the p-type back-to-back MOS switch 250 does not provide a conducting path between the output terminal GateDriver_Output and the supply voltage Vs.

The inverters I1, I2 are coupled between the voltage supply lines Vs, Vgnd. Inverter I1 provides an input driving voltage to a driving signal input terminal 222 of the protection circuit 220. The output voltage of the inverters I1, I2 vary between Vs and Vgnd.

The protection circuit 220 also comprises a driving signal output terminal 224 which is coupled to the common gates of the p-type back-to-back MOS switch 250, and a common source terminal 226 which is coupled to the common sources of the p-type back-to-back MOS switch 250. Under normal operating conditions, which means, when no high voltages are received at the output terminal GateDriver_Output, the driving signal received at the driving signal input terminal 222 is provided to the driving signal output terminal 224 such that the p-type back-to-back MOS switch 250 can operate as required.

However, in circumstances of several forms of stress, the voltage at the output terminal GateDriver_Output may raise substantially above the level of the supply voltage Vs. Such a raised voltage may damage the pMOSFETs PMV1, PMV2. If the channels of PMV2 is conducting (at least via the body diode of PMV2), the raised voltage is provided to the common sources of the p-type back-to-back MOS switch 250. As discussed above, the voltage of the common gates of the p-type back-to-back MOS switch 250 is substantially equal to Vgnd or Vs. Then, in such a situation with a raised voltage at the output terminal GateDriver_Output, the gate-source voltages of the pMOSFETs PMV1, PMV2 is relatively high and may cause breakdown of the pMOSFETs PMV1, PMV2. It is to be noted that the pMOSFETs PMV1, PMV2 are less sensitive for relatively high gate-drain voltages. A higher gate-drain voltage is required to cause a breakdown of the pMOSFETs PMV1, PMV2.

The protection circuit 220 comprises a gate source coupling switch 240 which prevents to large voltage differences between the voltage of the common gates and the voltage of the common sources of the p-type back-to-back MOS switch 250. The gate source coupling switch 240 comprises a third conduction path terminal 241, a fourth conduction path terminal 242 and a fifth terminal 243 for receiving a reference voltage Vref. The gate source coupling switch 240 has a second switchable conduction path between the third conduction path terminal 241 and the fourth conduction path terminal 242. The third conduction path terminal 241 is coupled to the common sources terminal 226 of the protection circuit 220. The fourth conduction path terminal 242 is coupled to the driving signal output terminal 224. Thus, the gate source coupling switch 240 is coupled between the common gates and common sources of pMOSFETs PMV1, PMV2 of the p-type back-to-back MOS switch 250. If the second conduction path is configured to be in a conducting mode, the voltage of the common gates becomes substantially equal to the voltage of the common sources of the of pMOSFETs PMV1, PMV2 and, thus, the pMOSFETs PMV1, PMV2 will not easily breakdown if the voltage at the common sources is relatively large compared to the supply voltage Vs. The gate source coupling switch 240 is configured to arranged the second conduction path in the conducting mode if the voltage received at its third conduction path terminal 241 (being equal to the voltage of the common source terminal 226, being equal to the voltage of the common sources of the pMOSFETs PMV1, PMV2) is larger than the received reference voltage. Thus, the reference voltage is a sort of threshold voltage for connecting the common gates to the common sources to prevent breakdown of the pMOSFETs PMV1, PMV2. In other situations the gate source coupling switch 240 may be configured to arrange the second conduction path in the non-conducting mode. In another embodiment, the gate source coupling switch 240 only arranges the second switchable conduction path into a conducting mode if the voltage of the common source terminal 226 raises above the reference voltage and the voltage of the common source terminal 226 is higher than the voltage of the driving signal output terminal 224. Otherwise the second switchable conduction path should be arranged in the non-conduction mode. In this embodiment, while the second switchable conduction path is in the conducting mode, a current may be provided to the common gate, but, if the level of the voltage levels of the common source and common gate are equal, the second switchable conduction path may be in the non-conduction mode because the pMOSFETs PMV1, PMV2 are switched off at that moment in time.

In the path from the driving signal input terminal 222 to the driving signal output terminal 224 (common gates of the p-type back-to-back MOS switch) a driving signal insulation switch 230 is provided. Especially when the driving signal output terminal 224 received via the gate source coupling switch 240 a high voltage, it is undesired to have a current path to the supply voltage, and, thus, if the voltage of the driving signal output terminal 224 is higher than the supply voltage, the driving signal insulation switch is arranged to disconnect the driving signal input terminal 222 from the driving signal output terminal 224. This prevents that, if the received driving signal at the driving signal input terminal 222 of the protection circuit 220 is the supply voltage, a current leaks to the supply voltage Vs lines and a MOSFET of inverter I1 may breakdown. In other words: The driving signal insulation switch 230 comprises a first conduction path terminal 231 coupled to the driving signal input terminal 222, a second conduction path terminal 232 coupled to the driving signal output terminal 224, and a first switchable conduction path between these two terminals 231, 232. It is assumed that the driving signal insulation switch 230 also receives the supply voltage, or that the driving signal insulation switch 230 assumes that the signal on its first conduction path terminal 231 is an indication of the supply voltage. The driving signal insulation switch is configured to arrange the first switchable conduction path in a non-conducting mode if the voltage at its second conduction path terminal 232 (being equal to the voltage of the driving signal output terminal 224) is larger than the supply voltage Vs. Then, an effective protection of circuits, which drive the signal received at the driving signal input terminal 222 against the high voltage, is obtained and no current is injected into the supply voltage Vs lines. In the other situations the driving signal insulation switch 230 may be configured to arrange the first switchable conduction path the in the conducting mode. In FIG. 2, by means of a dashed line, it is indicated that the driving signal insulation switch 230 may be connected to the supply voltage Vs to provide the driving signal insulation switch with the voltage to which it may compare the voltage of the driving signal output terminal 224 (which is received at its second conduction path terminal 232.

In another embodiment, the driving signal insulation switch 230 is configured to arrange the first switchable conduction path in only the non-conducting mode if the voltage received at the first conduction path terminal 231 is larger than the ground voltage (for example equal to the supply voltage Vs) and if at the same moment the voltage received at the second conduction path terminal 232 is larger than the voltage of the first conduction path terminal 231. This embodiment prevents that the high voltage is connected to the supply voltage. If the received input driving signal is equal to the ground voltage Vgnd, the driving signal insulation switch 230 may be in the conducting mode such that the charge associated with the high voltage is conducted to ground such that the level of the high voltage may decrease fast.

If, after the voltage level of the GateDriver_Output terminal was relatively high, the voltage level of this terminal returns to normal values, the voltage levels of the common source and/or common gate of the p-type back-to-back MOS switch 250 may return to a normal level as the result of a current conduction through the driving signal insulation switch 230 and the gate source coupling switch 240 if both switches are in a conducting mode. Otherwise the voltages of the common source and common gate are initially floating and leakage currents in the semiconductor device will remove the charge of these nodes and the gate driving circuitry returns to normal functioning after the returning of the voltage levels of the common gate and the common source to a normal voltage level (being a level in the range from the ground voltage Vgnd to the supply voltage Vs).

Tests have shown that the protection circuit 220 described above has a fast response to the reception of high voltage at the GateDriver_Output terminal and the tests revealed that the protection circuit 220 provides a good protection of the p-type back-to-back MOS switch 250. It was further seen that a current injection into the supply voltage Vs lines is reduced to a minimum.

In an embodiment of the circuitry 200, the reference voltage Vref is equal to the supply voltage Vs.

Figure 3A:
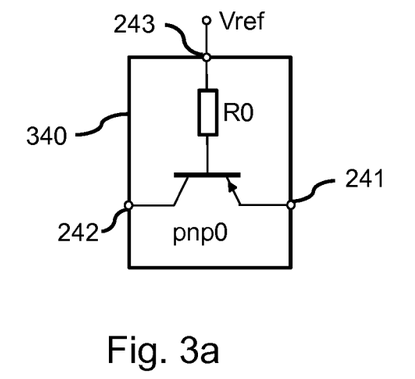

FIG. 3a schematically shows a first embodiment of a gate source coupling switch 340. The gate source coupling switch has a fifth terminal 243 for receiving a reference voltage Vref and has a third conduction path terminal 241 and a fourth conduction path terminal 242 and the gate source coupling switch 340 has a second switchable conduction path in between the third conduction path terminal 241 and a fourth conduction path terminal 242. The gate source coupling switch 340 comprises a pnp bipolar transistor pnp0 which is connected with its emitter to third conduction path terminal 241 and with its collector to fourth conduction path terminal 242 and thereby the emitter-collector path forms the second switchable conduction path. The base of the transistor pnp0 is connected to a resistor R0. Resistor R0 is connected in between the fifth terminal and the base of the transistor pnp0.

The operation of the gate source coupling switch 340 is explained on basis of circuitry 200 of FIG. 2 and in this paragraph it is assembled that the gate source coupling switch 340 is the gate source coupling switch 240 of FIG. 2. When the voltage of the common sources of the pMOSFETs PMV1, PMV2 raises above the reference voltage Vref, a current flows from the emitter to the base of the transistor pnp0, and, because of the operation of the pnp bipolar transistor pnp0, a current flows from the emitter to the collector. The current from the emitter to the base is limited by the resistor R0. Depending on the specific properties of the transistor pnp0, the current from the emitter to the collector is probably larger than the current from the emitter to the collector. The emitter-base current is injected into the reference voltage circuit. The emitter-collector current raises the voltage of the common gates of the pMOSFETs PMV1, PMV2. If the voltage of the common gates is equal to the common sources, the emitter-collector current of transistor pnp0, reduces to zero and the pMOSFETs PMV1, PMV2 are closed. Further, the driving signal insulation switch 230 is also closed in such an event which ensures that no damage occurs in inverter I1. Thus, use of the gate source coupling switch 340 in the protection circuit 220 leads to a desired operation of the protection circuit 220.

Figure 3B:
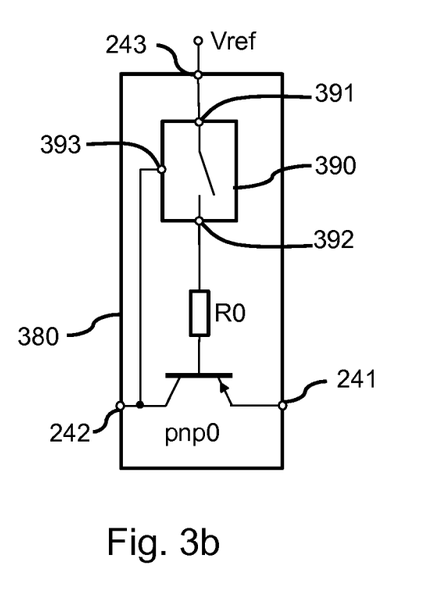

FIG. 3b schematically shows a second embodiment of a gate source coupling switch 380. The gate source coupling switch 380 is similar to the first embodiment of the gate source coupling switch 340, but the second embodiment comprises an additional reference voltage protection switch 390. The reference voltage protection switch 390 is for preventing the current injection in the reference voltage Vref supply lines. The reference voltage protection switch 390 comprises a fifth conduction path terminal 391, a sixth conduction path terminal 392 and a third switchable conduction path arranged in between the fifth conduction path terminal 391 and a sixth conduction path terminal 392. The reference voltage protection switch 390 further comprises a control terminal 393 for receiving a control voltage. The fifth conduction path terminal 391 is coupled to the reference voltage Vref, the sixth conduction path terminal 392 is coupled to the resistor R0—thus, the resistor R0 is coupled between the base of the transistor pnp0 and the sixth conduction path terminal 392 of the reference voltage protection switch 390. The control terminal 393 is coupled to the fourth conduction path terminal 242 of the gate source coupling switch 380. The reference voltage protection switch 390 is configured to arrange the third switchable conduction path in a non-conducting mode if the voltage received at the control terminal is higher than the reference voltage and to arrange the third switchable conduction path in a conducting mode otherwise. Thus, use of the gate source coupling switch 380 in the protection circuit 220 leads to a desired operation of the protection circuit 220 and current injection in the reference voltage Vref supply lines is prevented by the reference voltage protection switch 390.

Figure 4:
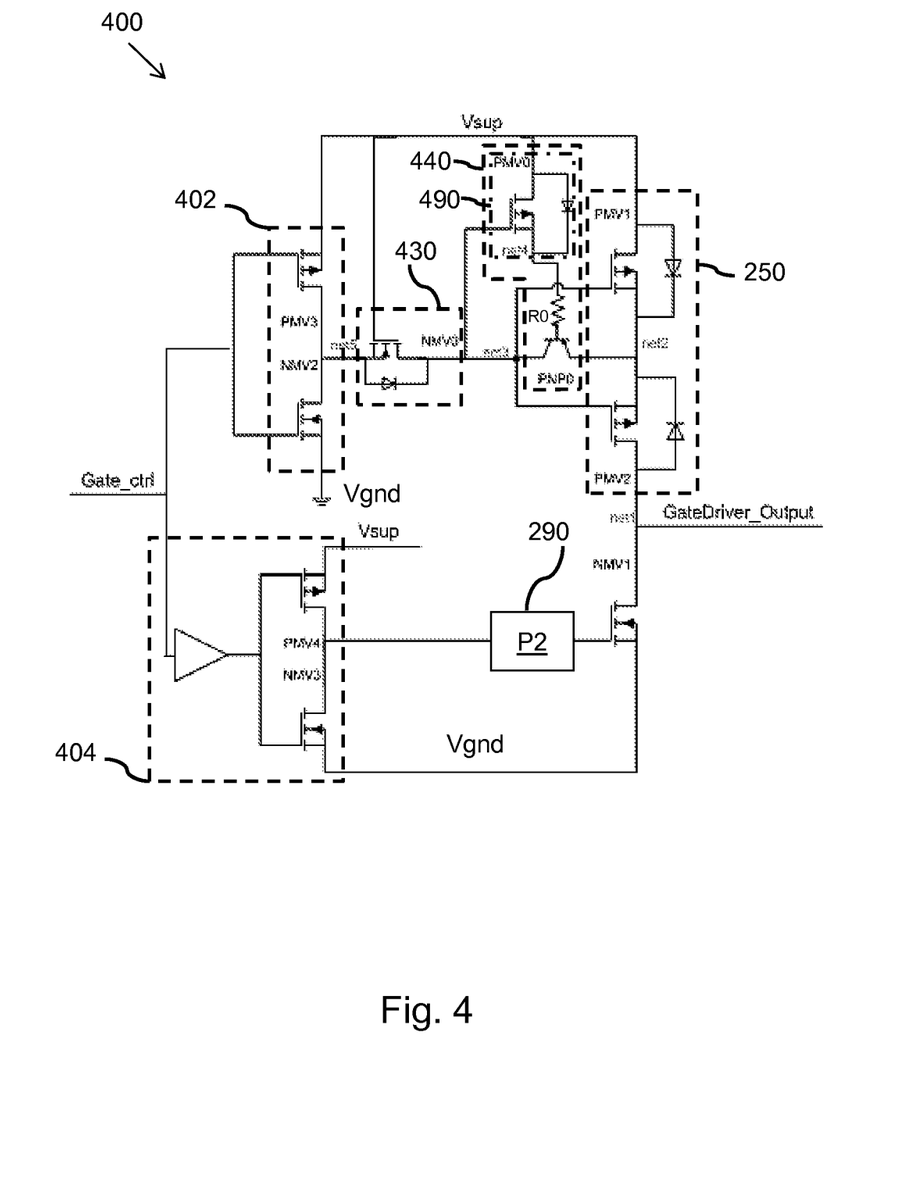

FIG. 4 schematically shows an embodiment of a gate driving circuitry 400. The gate driving circuitry 400 is similar to the gate driving circuitry 200.

The inverters I1, I2 are, respectively, implemented with the sub-circuits 402, 404. Each inverter 402, 404 comprises a combination of pMOSFET and a nMOSFET, respectively, the combinations PMV3/NMV2 and PMV4/NMV3. The p-type back-to-back MOS switch 250 is equal to the p-type back-to-back MOS switch 250 of FIG. 2. The nMOSFET NMV1 is used to couple the GateDriver_Output to a ground voltage Vgnd and the protection circuitry 290 protects the nMOSFET NMV1 against overload. The circuit receives a supply voltage Vsup.

The driving signal insulation switch 430 is implemented by means of an nMOSFET NMVO. The gate of the nMOSFET NMV0 is coupled to the supply voltage, the source is coupled to the output of inverter 402 (to receive an input driving voltage) and the drain is coupled to a net indicated in FIG. 4 with net 3, which is the net which is coupled to the common gates of the p-type back-to-back MOS switch 250. The body diode of the nMOSFET NMVO is drawn for clarity. The driving signal insulation switch 430 as implemented according to the implementation of FIG. 4, is arranged to close a switchable conduction path between the output of the inverter 402 and the common gates of the p-type back-to-back MOS switch 250 if the voltage of the common gates is higher than the supply voltage Vsup and the output voltage of the inverter 402 is equal to the supply voltage Vsup - otherwise the switchable conduction path is in a conducting mode. The driving signal insulation switch 430 of FIG. 4 prevents that a current from the common sources, via the common gates, is leaked in to the supply voltage Vsup net. Such a current may flow via the driving signal insulation switch 430 and the inverter 402 to the ground voltage lines Vgnd.

The gate source coupling switch 440 is implemented in a manner which is similar to the second embodiment of the gate source coupling switch 380 of FIG. 3b. The gate source coupling switch 440 comprises a reference voltage protection switch 490 which is implemented by means of a pMOSFET PMVO. The gate of the pMOSFET PMVO is coupled to the common gates of the p-type back-to-back MOS switch 250, the source is coupled to the resistor R0, and the drain is coupled to the supply voltage Vsup.

The circuitry 400 may be implemented in an integrated circuit which is manufactured on semiconductor material to obtain a gate driving semiconductor device. The circuitry 400 may further be integrated into other circuits, such as automotive circuits in which gates have to be driven.

In an embodiment, at least the nMOSFETs NMV0, NMV1, at least he pMOSFETs PMV0, PMV1, PMV2 and the transistor pnp0 are designed to withstand relatively high voltages such that a sudden reception of a high voltage at the GateDriver_Output does not breakdown the MOSFETs and transistor. The relatively high voltages are at least 5 times larger than the supply voltage Vsup of the circuitry 400. In another embodiment, the relatively high voltage is at least 10 times larger than the supply voltage Vsup of the circuitry 400.

Further, the input signal of the circuitry 400 gate_ctrl may be a signal which varies between a ground voltage Vgnd and another voltage which is higher than the ground voltage Vgnd but lower than the supply voltage Vsup of the circuitry 400. Thus, the circuitry that generates the input signal gate_ctrl operates at a lower supply voltage. The circuitry 400 may be used, besides protecting the lower voltage circuitry against high voltages, to drive a gate at a higher supply voltage Vsup then the supply voltage of a circuitry which provides the gate_ctrl signal. Thus, the circuitry 400 provides an effective gate driving circuitry which also isolates the lower voltage circuitry from the higher voltage circuitry. In order to provide this effect, the inverter I1, 402 and I2, 404 are further configured to operate as a level shifter for shifting the maximum level of the gate_ctrl signal to the level of the supply voltage Vs, Vsup of the inverters I1, 402, I2, 404. Further, at least the nMOSFETs NMV0, NMV1, at least the pMOSFETs PMV0, PMV1, PMV2 and the transistor pnp0 are designed to operate at higher voltage and are designed to have a higher breakdown voltage.

In a short summary, the invention relates to a protection circuit 220 and a gate driving circuitry 200. The protection circuit 220 is for protecting a p-type back-to-back MOS switch 250. The circuit 220 receives an input driving signal and provides a driving output signal to common gates of the p-type back-to-back MOS switch 250. The circuit comprises a driving signal insulation switch 230 for disconnecting the common gate of the p-type back-to-back MOS switch 250 from the received input driving signal when the voltage of the common gates is larger than the supply voltage of the circuit 220. The circuit 220 further comprises a gate source coupling switch 240 for coupling a voltage received at the common source of the p-type back-to-back MOS switch 250 to the common gate if a received voltage at the common sources is larger than a reference voltage Vref.

In the foregoing specification, the invention has been described with reference to specific examples of embodiments of the invention. It will, however, be evident that various modifications and changes may be made therein without departing from the broad scope of the invention as set forth in the appended claims, which accordingly are not limited to the specific examples shown. For example, the connections may be a type of connection suitable to transfer signals from or to the respective nodes, units or devices, for example via intermediate devices. Accordingly, unless implied or stated otherwise the connections may for example be direct connections or indirect connections. Further, for example, the controllable switches discussed in the application may be implemented by means of the disclosed MOSFETs but also by means of other transistors or other circuits suitable for performing the switching function.

The semiconductor material for a semiconductor substrate described herein can be any semiconductor material or combinations of materials, such as gallium arsenide, silicon germanium, silicon-on-insulator (SOI), silicon, monocrystalline silicon, the like, and combinations of the above.

Signals described in this application are indicated as low or high voltage or as low or high signals. It is to be noted that the skilled person is capable of matching the terms low or high with appropriate voltages. The scope of the invention is not only limited to signals in the form of voltages. Currents may also be used to drive the circuitry and/or to control controllable switches as described in the application.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention has been described with respect to specific conductivity types or polarity of potentials, skilled artisans appreciated that conductivity types and polarities of potentials may be reversed.

Thus, it is to be understood that the architectures depicted herein are merely exemplary, and that in fact many other architectures can be implemented which achieve the same functionality. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

Also for example, in one embodiment, the illustrated elements of circuitry 200 are circuitry located on a single integrated circuit or within a same device. Alternatively, circuitry 200 may include any number of separate integrated circuits or separate devices interconnected with each other.

Furthermore, those skilled in the art will recognize that boundaries between the functionality of the above described operations merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements The mere fact that certain measures are recited in mutually different claims does not indicate that a combination of these measures cannot be used to advantage.

The invention claimed is:

1. A protection circuit for a p-type back-to-back MOS switch, the protection circuit arranged in the driving path of the p-type back-to-back MOS switch, the p-type back-to-back MOS switch having two p-type MOSFETS with common sources and common gates, the protection circuit comprising:
a driving signal input terminal for receiving an input driving signal;
a driving signal output terminal for providing a driving signal to the common gates;
a common source terminal for being coupled to the common sources;
a driving signal insulation switch having a first conduction path terminal, a second conduction path terminal and a first switchable conduction path coupled between the first conduction path terminal and the second conduction path terminal, the first conduction path terminal coupled to the driving signal input terminal, the second conduction path terminal coupled to the driving signal output terminal, and the driving signal insulation switch configured to arrange the first conduction path in a non-conducting mode if a voltage of the driving signal output terminal exceeds a supply voltage of the protection circuit; and
a gate source coupling switch having a third conduction path terminal, a fourth conduction path terminal, a fifth terminal for receiving a reference voltage and a second switchable conduction path between the third conduction path terminal and the fourth conduction path terminal, the third conduction path terminal coupled to the common source terminal and the fourth conduction path terminal coupled to the driving signal output terminal, the gate source coupling switch configured to arrange the second conduction path in a conducting mode if a voltage of the common source terminal raises above the reference voltage.

2. The protection circuit according to claim 1, wherein the reference voltage is the supply voltage.

3. The protection circuit according to claim 1, wherein the driving signal insulation switch is configured to arrange the first conduction path into the conductive mode if the voltage of the driving signal output terminal is not higher than the supply voltage.

4. The protection circuit according to claim 1, wherein the driving signal insulation switch is configured to arrange the first conduction path only in a non-conducting mode if a voltage of the input driving signal is unequal to a ground voltage and a voltage of the driving signal output terminal exceeds the supply voltage, and the driving signal insulation switch is configured to arrange the first conduction path in a conducting mode if the voltage of the driving signal output terminal is not larger than the supply voltage.

5. The protection circuit according to claim 1, wherein the driving signal insulation switch comprises a n-channel MOSFET coupled with its gate to the supply voltage of the protection circuit, with its source to the first conduction path terminal and with its drain to the second conduction path terminal.

6. The protection circuit according to claim 1, wherein the gate source coupling switch is configured to arrange the second switchable conduction path into the non-conductive mode if the voltage of the common source terminal is not higher than the reference voltage.

7. The protection circuit according to claim 1, wherein the gate source coupling switch is configured to arrange the second switchable conduction path only in the conducting mode if the voltage of the common source terminal exceeds the reference voltage and the voltage of the common source terminal is higher than the voltage of the driving signal output terminal and the gate source coupling switch is configured to arrange the second switchable conduction path in a non-conducting mode otherwise.

8. The protection circuit according to claim 1, wherein the gate source coupling switch comprises a pnp bipolar transistor and a resistor which is coupled between the reference voltage and the base of the pnp bipolar transistor, the emitter of the pnp bipolar transistor is coupled to the third conduction path terminal and the collector of the pnp bipolar transistor is coupled to the fourth conduction path terminal.

9. The protection circuit according to claim 8, wherein the gate source coupling switch comprises a reference voltage protection switch which includes a fifth conduction path terminal, a sixth conduction path terminal, a third switchable conduction path arranged in between the first conduction path terminal and the sixth conduction path terminal, and a control terminal for receiving a control signal, the fifth conduction path terminal is coupled to the reference voltage, the sixth conduction path terminal is coupled to the resistor, the control terminal is coupled to the driving signal output terminal, the reference voltage protection switch is configured to arrange the third switchable conduction path in a non-conducting mode if a voltage received at the control terminal is higher than the reference voltage and to arrange the third switchable conduction path in the conducting mode otherwise.

10. The protection circuit according to claim 9, wherein the reference voltage protection switch comprises a p-channel MOSFET which is coupled with its gate to the control terminal, with its drain to the fifth conduction path terminal and with its source to the sixth conduction path terminal.

11. A gate driving circuitry comprising the p-type back-to-back MOS switch and the protection circuit of claim 1.

12. A gate driving circuitry according to claim 11, wherein the p-type back-to-back MOS switch comprises a first p-channel MOSFET and a second p-channel MOSFET, wherein the sources of the first p-channel MOSFET and a second p-channel MOSFET are connected to each other and the gates of the first p-channel MOSFET and a second p-channel MOSFET are connected to each other.

13. A gate driving circuitry according to claim 11 further comprising an inverter circuit for inverting an input signal and to provide the inverted input signal as the input driving signal to the driving signal input terminal.

14. A gate driving circuitry according to claim 13, wherein the inverter circuit is configured to operate as a lever shifting circuitry which is configured to receive an input signal which varies between a ground voltage and another supply voltage which is lower than the supply voltage of the gate driving circuitry.

15. A gate driving circuitry according to claim 11, wherein the p-type back-to-back MOS switch couples an output terminal of the circuitry to the supply voltage if the input signal of the gate driving circuitry is high, the gate driving circuitry further comprises a n-channel MOSFET for coupling the output terminal to the ground voltage if an input signal of the gate driving circuitry is low.

16. A gate driving circuitry according to claim 11, further comprising an overload protection circuit which is configured to protect the n-channel MOSFET for an overload.

17. A gate driving circuitry according to claim 11, wherein at least one of the p-type back-to-back MOS switch, the driving signal insulation switch and the gate source coupling switch are configured to withstand a high voltage.

18. A gate driving circuitry according to claim 17, wherein the high voltage is at least 5 times larger than the supply voltage of the gate driving circuitry.

19. An integrated circuit device comprising the gate driving circuitry according to claim 11.

20. An integrated circuit device comprising a protection circuit, wherein the protection circuit comprises:
- a driving signal input terminal for receiving an input driving signal;
- a driving signal output terminal for providing a driving signal to the common gates;
- a common source terminal for being coupled to the common sources;
- a driving signal insulation switch comprising a first conduction path terminal, a second conduction path terminal and a first switchable conduction path coupled between the first conduction path terminal and the second conduction path terminal, the first conduction path terminal being coupled to the driving signal input terminal, the second conduction path terminal being coupled to the driving signal output terminal, and the driving signal insulation switch being configured for arranging the first conduction path in a non-conducting mode if a voltage of the driving signal output terminal exceeds a supply voltage of the protection circuit; and
- a gate source coupling switch comprising a third conduction path terminal, a fourth conduction path terminal, a fifth terminal for receiving a reference voltage and a second switchable conduction path between the third conduction path terminal and the fourth conduction path terminal, the third conduction path terminal being coupled to the common source terminal and the fourth conduction path terminal being coupled to the driving signal output terminal, the gate source coupling switch being configured to arrange the second conduction path in a conducting mode if a voltage of the common source terminal raises above the reference voltage.

* * * * *